United States Patent
Chen et al.

(10) Patent No.: US 10,646,038 B2
(45) Date of Patent: May 12, 2020

(54) SLIDE RAIL ASSEMBLY AND SLIDE RAIL KIT THEREOF

(71) Applicants: King Slide Works Co., Ltd., Kaohsiung (TW); King Slide Technology Co., Ltd., Kaohsiung (TW)

(72) Inventors: Ken-Ching Chen, Kaohsiung (TW); Shun-Ho Yang, Kaohsiung (TW); Wei-Chen Chang, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 0 days.

(21) Appl. No.: 16/127,435

(22) Filed: Sep. 11, 2018

(65) Prior Publication Data
US 2019/0335903 A1 Nov. 7, 2019

(30) Foreign Application Priority Data
May 7, 2018 (TW) .............................. 107115670 A

(51) Int. Cl.
*A47B 88/42* (2017.01)
*H05K 7/14* (2006.01)
*A47B 88/427* (2017.01)

(52) U.S. Cl.
CPC ......... *A47B 88/427* (2017.01); *H05K 7/1489* (2013.01); *A47B 2088/4274* (2017.01); *A47B 2210/0081* (2013.01)

(58) Field of Classification Search
CPC .... A47B 2088/4272; A47B 2088/0425; A47B 2088/4274; A47B 2088/0429;
(Continued)

(56) References Cited

U.S. PATENT DOCUMENTS 6,209,979 B1 * 4/2001 Fall ...................... H05K 7/1489
312/319.1
6,601,933 B1 * 8/2003 Greenwald .......... H05K 7/1489
312/330.1

(Continued)

FOREIGN PATENT DOCUMENTS

EP 3307038 A1 4/2018
GB 2434081 A 7/2007

*Primary Examiner* — Andrew M Roersma
(74) *Attorney, Agent, or Firm* — Alan D. Kamrath; Karin L. Williams; Mayer & Williams PC

(57) ABSTRACT

A slide rail assembly includes a first rail, a second rail, a first mechanism, a second mechanism and a releasing connection rod. The first rail has a blocking part. The second rail includes a first end, a second end and a plurality of slots arranged between the first and second ends. The first mechanism includes a working member for blocking one of the slots. The second mechanism includes a blocking member. When the second rail is located at an extension position, the blocking member is corresponding to the blocking part, such that the second rail cannot be moved away from the extension position along a direction. The releasing connection rod includes an operating part arranged between the first end and the first mechanism. The operating part, is configured to be operated, such that the releasing connecting rod drives the blocking member to move away from the position.

15 Claims, 9 Drawing Sheets

(58) Field of Classification Search
CPC .... A47B 2088/4276; A47B 2088/0433; A47B 2088/4278; A47B 2088/0437; A47B 2088/4235; A47B 2088/0444; A47B 2210/0016; A47B 2210/0018; A47B 2210/0081; A47B 2210/0086; A47B 2210/0089; A47B 88/423; A47B 88/0418; A47B 88/427; A47B 88/0422; A47B 88/44; A47B 88/443; A47B 88/473; A47B 88/477; A47B 88/57; A47B 88/16; A47B 88/40; A47B 88/50; A47B 88/53; H05K 7/1489

See application file for complete search history.

(56) References Cited

U.S. PATENT DOCUMENTS

| | | | |
|---|---|---|---|
| 6,851,774 B2* | 2/2005 | Chen | A47B 88/467 |
| | | | 312/334.47 |
| 6,935,710 B2* | 8/2005 | Chen | A47B 88/50 |
| | | | 312/333 |
| 6,938,967 B2* | 9/2005 | Dubon | H05K 7/1421 |
| | | | 312/330.1 |
| 7,481,504 B2 | 1/2009 | Chen et al. | |
| 8,118,267 B2* | 2/2012 | Yu | H05K 7/1489 |
| | | | 248/222.11 |
| 8,297,721 B2 | 10/2012 | Yu et al. | |
| 9,670,956 B2 | 6/2017 | Judge | |
| 9,675,175 B1* | 6/2017 | Chen | A47B 57/36 |
| 9,848,701 B1* | 12/2017 | Chen | A47B 88/49 |
| 2004/0108797 A1* | 6/2004 | Chen | A47B 88/427 |
| | | | 312/334.7 |
| 2006/0091769 A1* | 5/2006 | Dubon | A47B 88/49 |
| | | | 312/333 |
| 2008/0124009 A1* | 5/2008 | Peng | A47B 88/57 |
| | | | 384/21 |

* cited by examiner

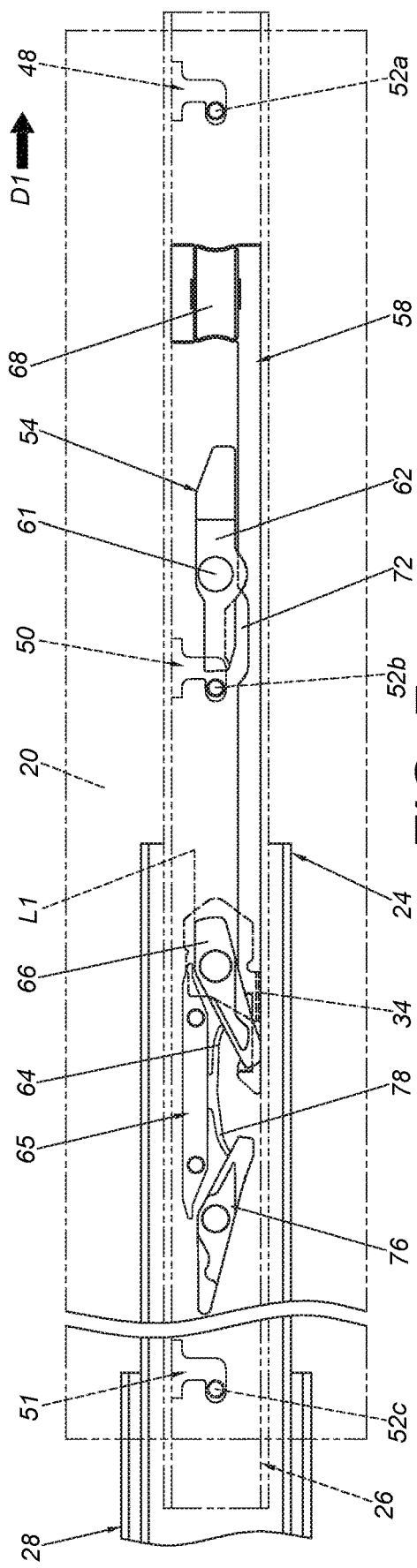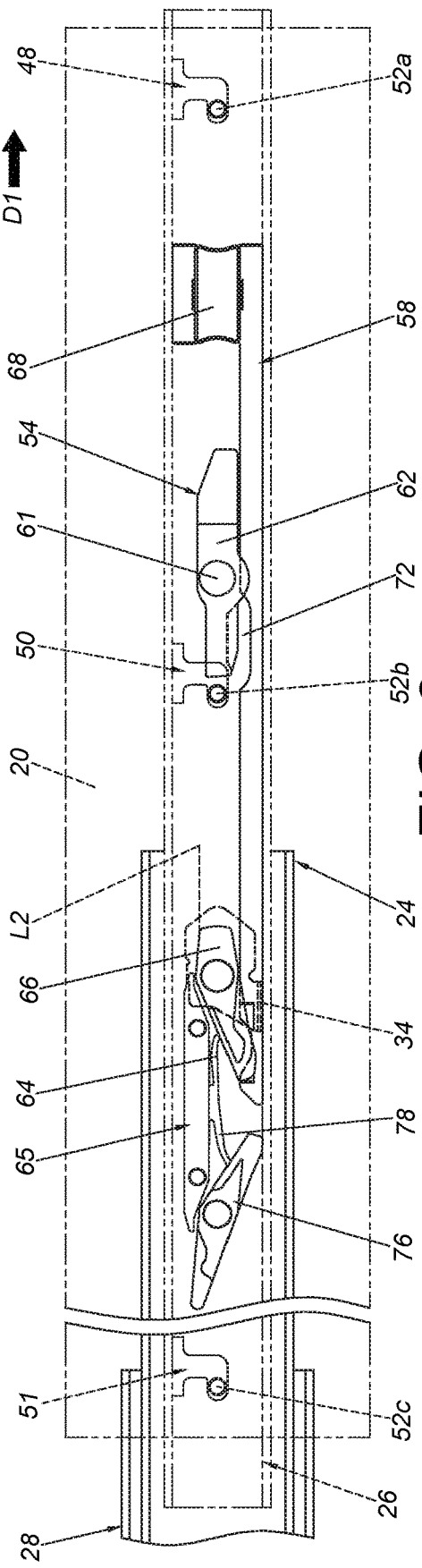

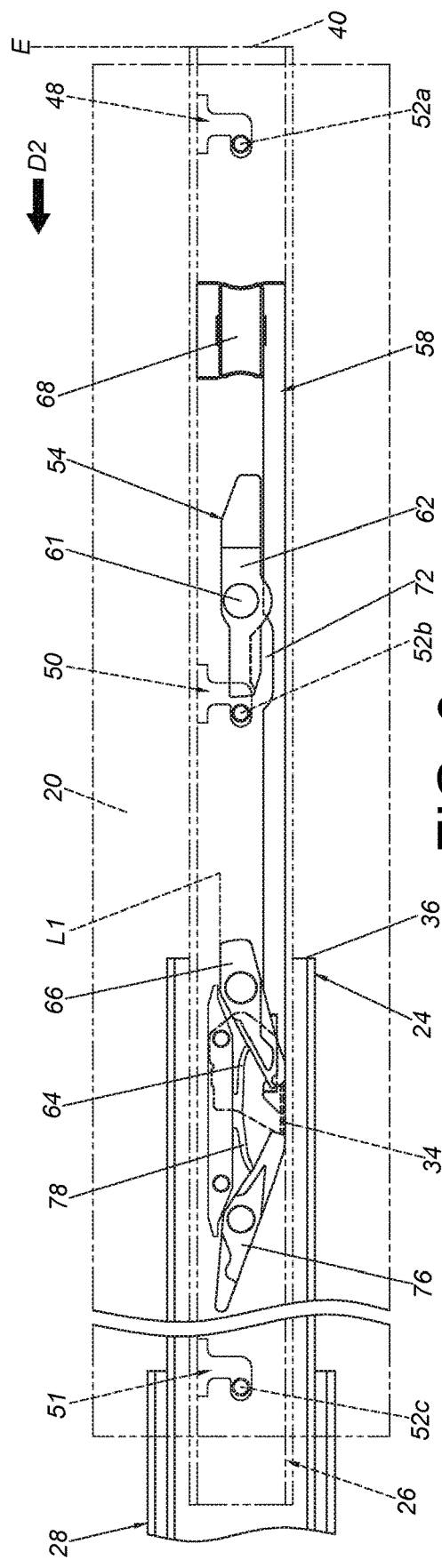

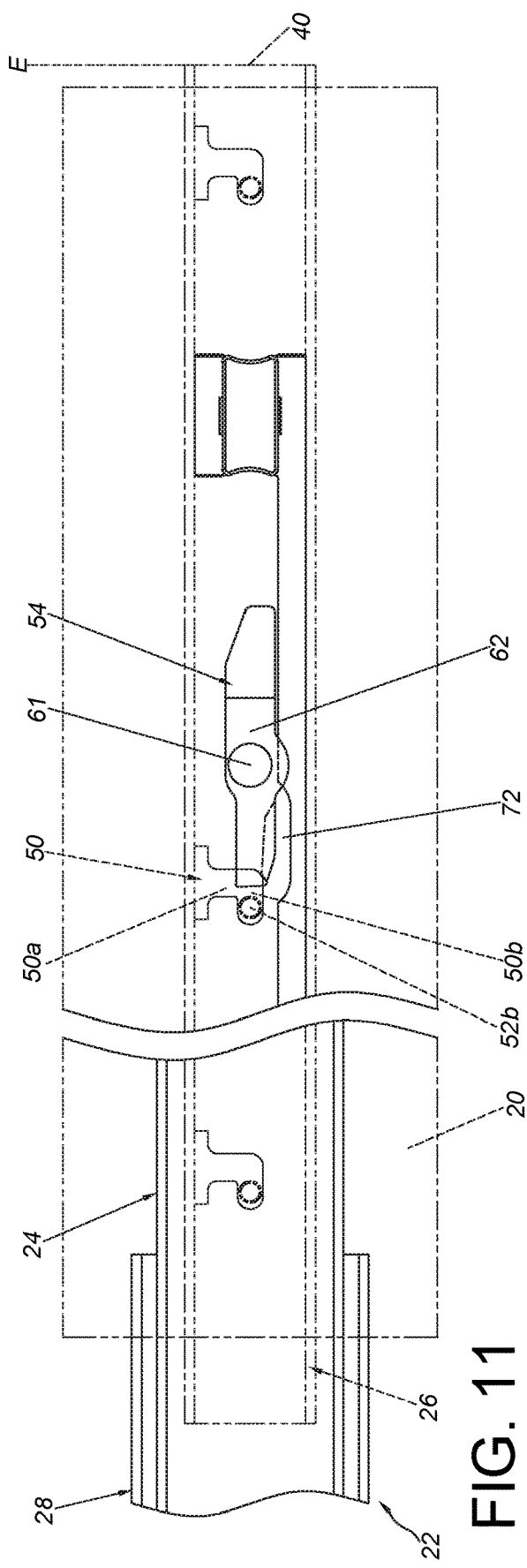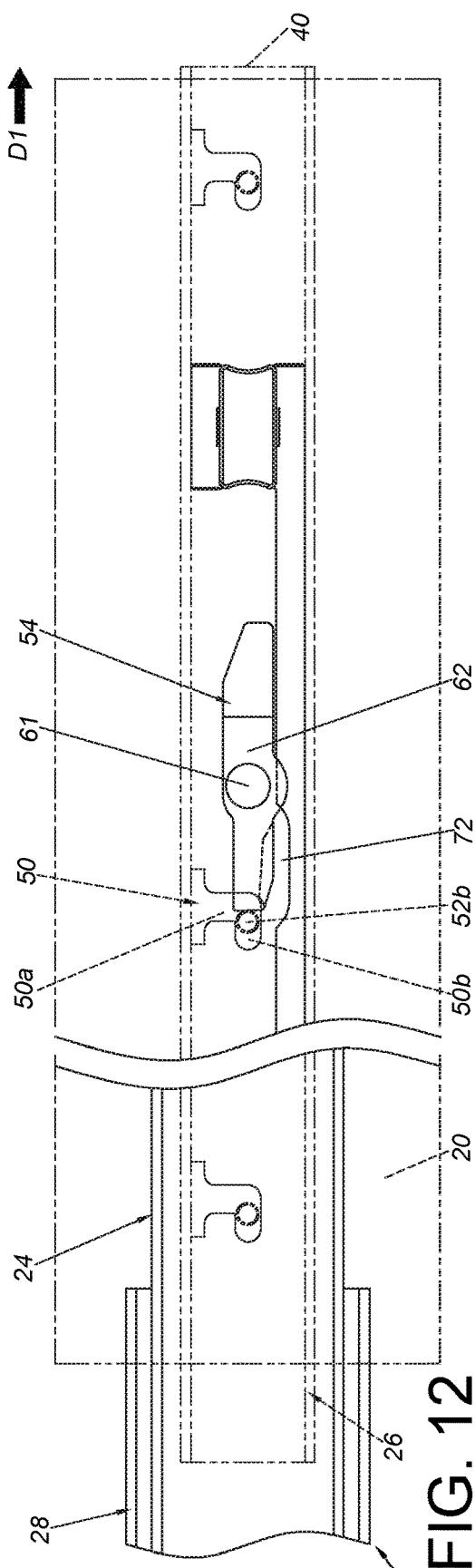

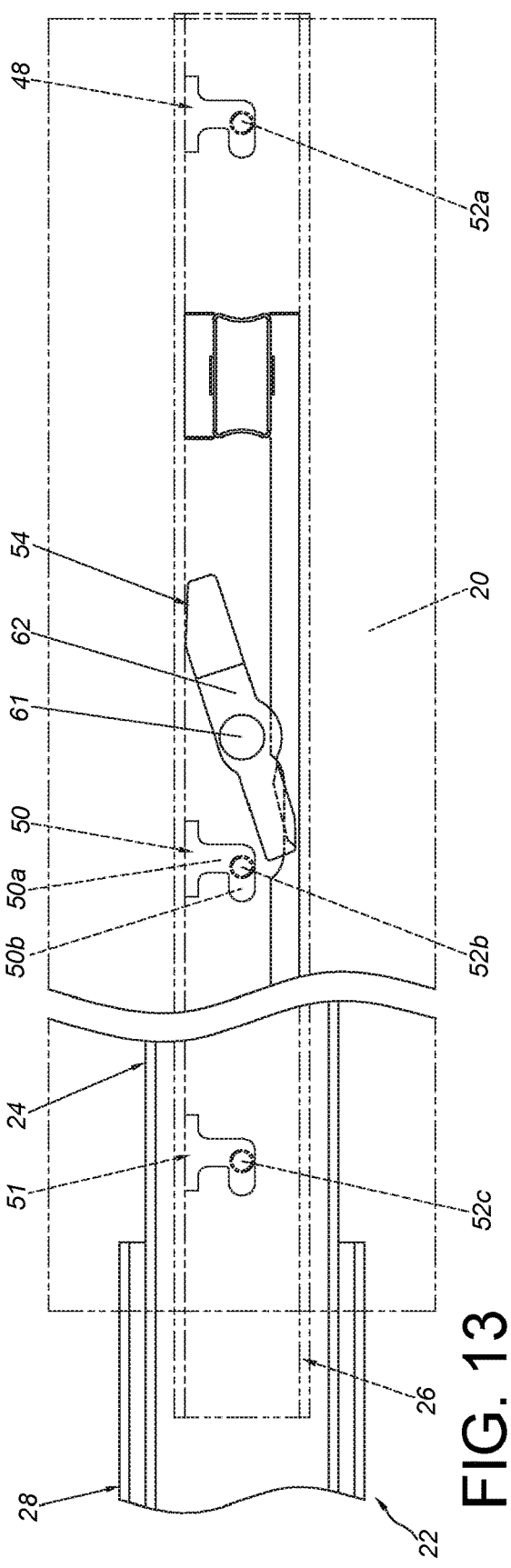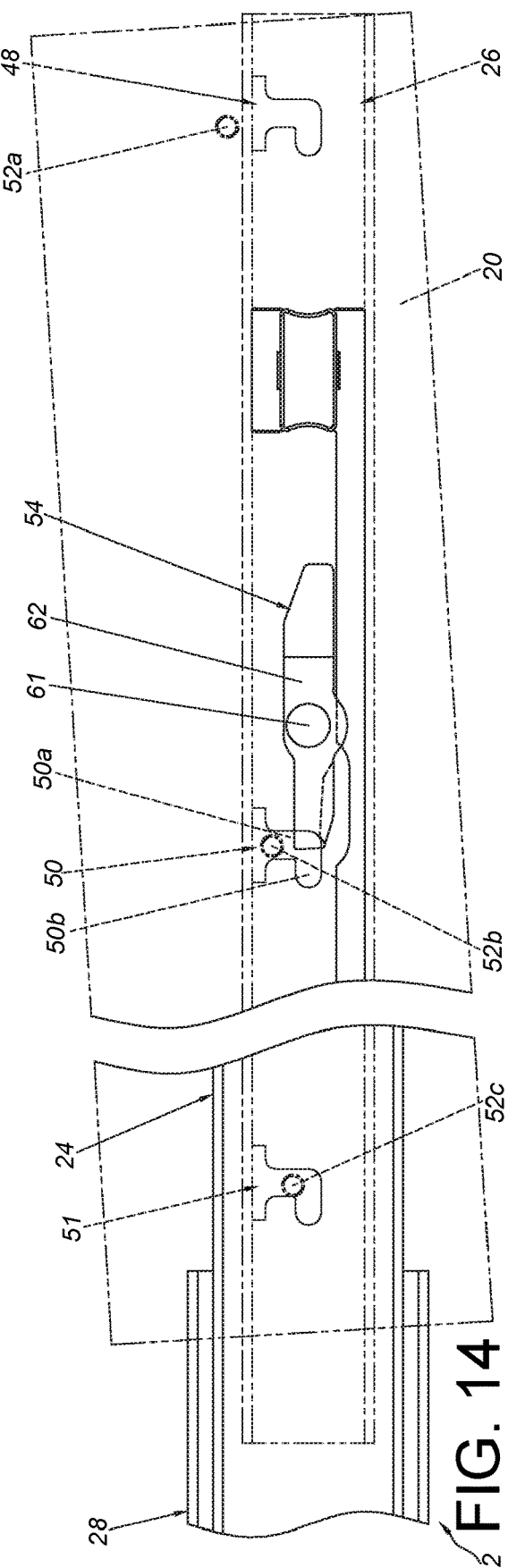

SLIDE RAIL ASSEMBLY AND SLIDE RAIL KIT THEREOF

BACKGROUND OF THE INVENTION

1. Field of the Invention

The present invention relates to a slide rail assembly, and more particularly, to a slide rail assembly having a releasing connection rod which allows a user to conveniently operate other object for facilitating maintenance of slide rails.

2. Description of the Prior Art

U.S. Pat. No. 9,670,956 B2 discloses a slide assembly (20) comprising an outer slide segment (22), an intermediate slide segment (24) and an inner slide segment (26) telescopically engaged with one another. Wherein, as shown in FIG. 12 and FIG. 14 of the aforementioned application, the inner slide segment (26) comprises a locking mechanism (160) corresponding to one of a plurality of slots (150) arranged on the inner slide segment (26). The plurality of slots (150) is configured to receive a plurality of mounting pins provided on a server. Wherein, one end (such as a rearward end) of a spring arm (162) of the locking mechanism (160) is secured to the inner slide segment (26) by a fastener, and the spring arm (162) of the locking mechanism (160) can selectively secure or restrict one of the mounting pines within the associated slot (150).

However, according to such design of the plurality of mounting pins of the server, during a mounting process, the server is required to be lifted above the inner slide segment (26), and then dropped into the slots (150) so as to bias the spring arm (162) of the locking mechanism (160) by the mounting pins (or the spring arm (162) of the locking mechanism (160) can be manually moved in advance). As such, the server can be mounted to the inner slide segment (26), and prevented from being freely detached from the inner slide segment (26) through the locking mechanism (160).

Though operation of the locking mechanism (160) of the aforementioned application does not interfere with operation of a release mechanism (94), it is required to cross over the locking mechanism (160) to operate the release mechanism (94). Thus, the slide assembly (20) is not smooth in operation.

SUMMARY OF THE INVENTION

The present invention relates to a slide rail assembly having a releasing connection rod which allows a user to conveniently operate other object for facilitating maintenance of slide rails.

According to an embodiment of the present invention, a slide rail assembly comprises a first rail, a second rail, a first mechanism, a second mechanism and a releasing connection rod. The first rail is arranged with a blocking part. The second rail is movable relative to the first rail. The second rail has a first end, a second end and a plurality of slots arranged between the first end and the second end. The first mechanism is arranged on the second rail. The first mechanism comprises an elastic member and a working member partially extended to one of the plurality of slots of the second rail in response to an elastic force of the elastic member. Wherein, the working member is configured to be operated to move away from one of the plurality of slots of the second rail along a first path. The second mechanism is arranged on the first rail. The second mechanism comprises an elastic part and a blocking member. Wherein, the blocking member is configured to be held at a blocking position in response to an elastic force of the elastic part. When the second rail is moved relative to the first rail to an extension position, the blocking member of the second mechanism is located at the blocking position and corresponding to the blocking part of the first rail, such that the second rail is not able to move away from the extension position relative to the first rail along a predetermined direction. The releasing connection rod comprises an operating part located between the first end of the second rail and the first mechanism. The operating part is configured to be operated to move the releasing connection rod along a second path in order to drive the blocking member of the second mechanism to move away from the blocking position to be no longer corresponding to the blocking part of the first rail.

Preferably, the plurality of slots are arranged along a longitudinal direction of the second rail. The plurality of slots comprises a first slot and a second slot. The first slot is adjacent to the first end of the second rail, and the second slot is adjacent to the first mechanism.

Preferably, a predetermined distance is defined between two adjacent slots.

Preferably, the second rail comprises a first wall, a second wall and a longitudinal wall connected between the first wall and the second wall. The releasing connection rod is arranged along a longitudinal direction of the longitudinal wall of the second rail. The working member of the first mechanism is pivoted relative to the longitudinal wall of the second rail, and the working member is adjacent to the releasing connection rod.

Preferably, during a process of the working member being operated to move away from one of the plurality of slots of the second rail along the first path, the working member is configured to be prevented from interfering with the releasing connection rod, such that the working member is not blocked by the releasing connection rod on the first path.

Preferably, one of the releasing connection rod and the working member has a notch, and the other one of the releasing connection rod and the working member has a recessed part. During the process of the working member being operated to move away from one of the plurality of slots of the second rail along the first path, the working member is configured to be prevented from interfering with the releasing connection rod through arrangement of the recessed part and the notch.

Preferably, a direction of the first path is different from a direction of the second path.

Preferably, the first rail has a first end and a second end. The blocking part is adjacent to the first end of the first rail.

According to another embodiment of the present invention, a slide rail assembly comprises a first rail, a second rail, a first mechanism, a second mechanism and a releasing connection rod. The first rail is arranged with a blocking part. The second rail is movable relative to the first rail. The second rail has a first end, a second end and a plurality of slots arranged between the first end and the second end. The first mechanism is arranged on the second rail. The first mechanism comprises an elastic member and a working member configured to block one side of one of the plurality of slots of the second rail in response to an elastic force of the elastic member. Wherein, the working member is configured to be operated to move along a first path without blocking one of the plurality of slots of the second rail. The second mechanism is arranged on the second rail. The second mechanism comprises a blocking member. When the second rail is moved relative to the first rail to an extension position, the blocking member of the second mechanism is located at a blocking position and corresponding to the blocking part of the first rail, such that the second rail is not able to move away from the extension position relative to the first rail along a predetermined direction. The releasing connection rod comprises an operating part arranged between the first end of the second rail and the first mechanism. The operating part is configured to be operated to move the releasing connection rod along a second path in order to drive the blocking member of the second mechanism to move away from the blocking position to be no longer corresponding to the blocking part of the first rail.

According to another embodiment of the present invention, a slide rail kit comprises a rail, a first mechanism, a second mechanism and a releasing connection rod. The rail has a first end, a second end and a plurality of slots arranged between the first end and the second end. The rail comprises a first wall, a second wall and a longitudinal wall connected between the first wall and the second wall. The first mechanism is arranged on the rail. The first mechanism comprises an elastic member and a working member configured to block one side of one of the plurality of slots of the rail in response to an elastic force of the elastic member. Wherein, the working member is configured to be operated to move along a first path without blocking one of the plurality of slots of the rail. The second mechanism is arranged on the rail. The second mechanism comprises a blocking member, wherein the blocking member is configured to be located at a blocking position. The releasing connection rod is operatively arranged on the rail. The releasing connection rod comprises an operating part configured to be operated to move the releasing connecting rod along a second path in order to drive the blocking member of the second mechanism to move away from the blocking position. Wherein, the releasing connection rod is arranged along a longitudinal direction of the longitudinal wall of the rail. The working member of the first mechanism is pivoted relative to the longitudinal wall of the rail and adjacent to the releasing connection rod. During a process of the working member being operated to move along the first path, the working member is configured to be prevented from interfering with the releasing connection rod.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 7 is a diagram showing a first rail and a second rail of the slide rail assembly being moved relative to the third rail along a first direction according to an embodiment of the present invention;

FIG. 8 is a diagram showing the second rail of the slide rail assembly being further moved relative to the first rail along the first direction according to an embodiment of the present invention;

FIG. 9 is a diagram showing the second rail of the slide rail assembly being further moved relative to the first rail along the first direction to an extension position according to an embodiment of the present invention;

FIG. 10 is a diagram showing the slide rail assembly being in an extended state, and a releasing connection rod being operated to move according to an embodiment of the present invention;

FIG. 11 is a diagram showing the slide rail assembly being in the extended state, and the working member being configured to restrict a mounting member of the carried object in the slot of the second rail according to an embodiment of the present invention;

FIG. 12 is a diagram showing the slide rail assembly being in the extended state, and the carried object being slightly moved relative to the second rail along the first direction according to an embodiment of the present invention;

FIG. 13 is a diagram showing the slide rail assembly being in the extended state, and the working member being operated to move without restricting the mounting member in the sloe of the second rail according to an embodiment of the present invention; and FIG. 14 is a diagram showing the slide rail assembly being in the extended state, and the carried object being detached from the second rail according to an embodiment of the present invention.

DETAILED DESCRIPTION

Figure 1:
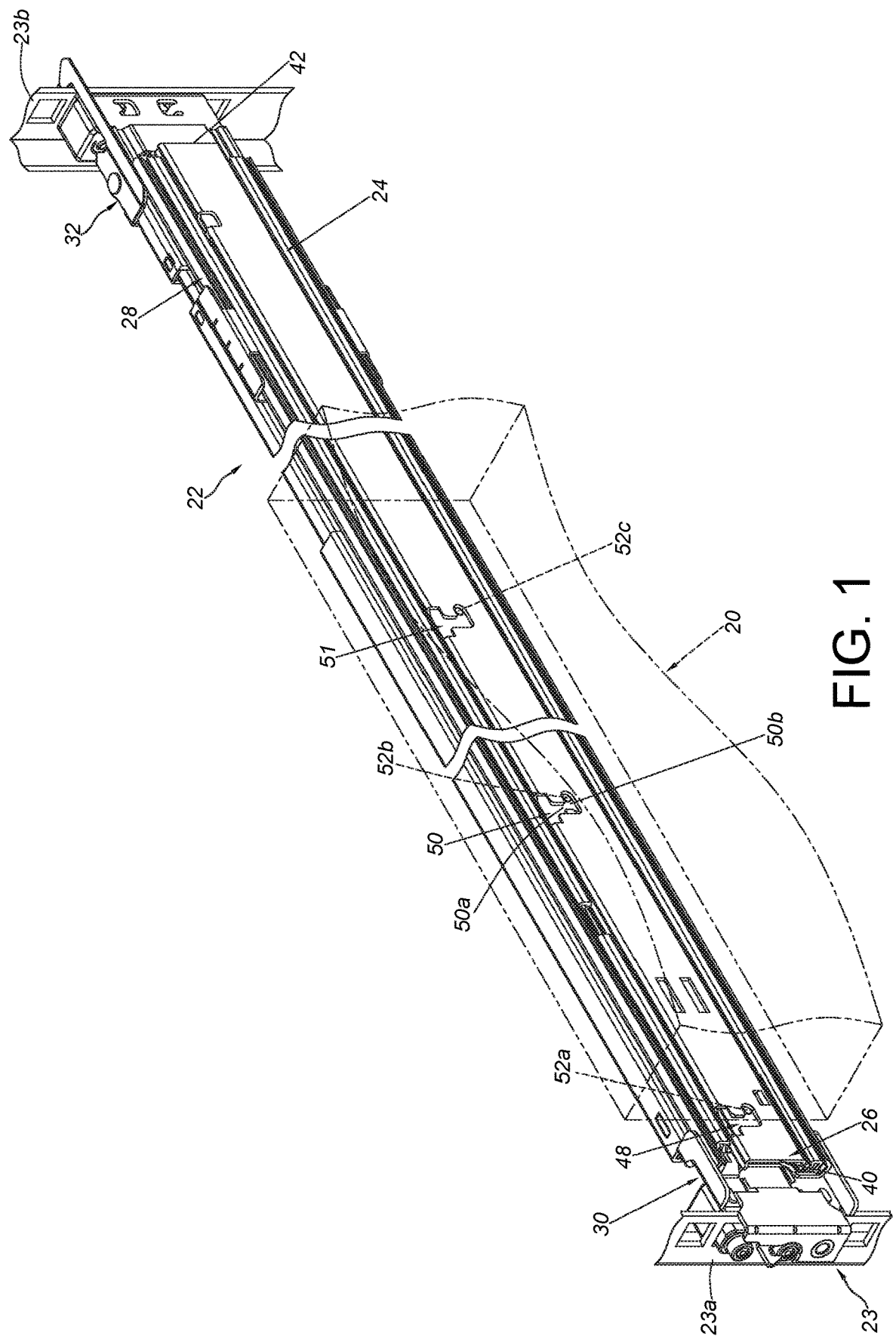
FIG. 1 is a diagram showing a slide rail assembly capable of mounting a carried object to a rack according to an embodiment of the present invention.
Figure 2:
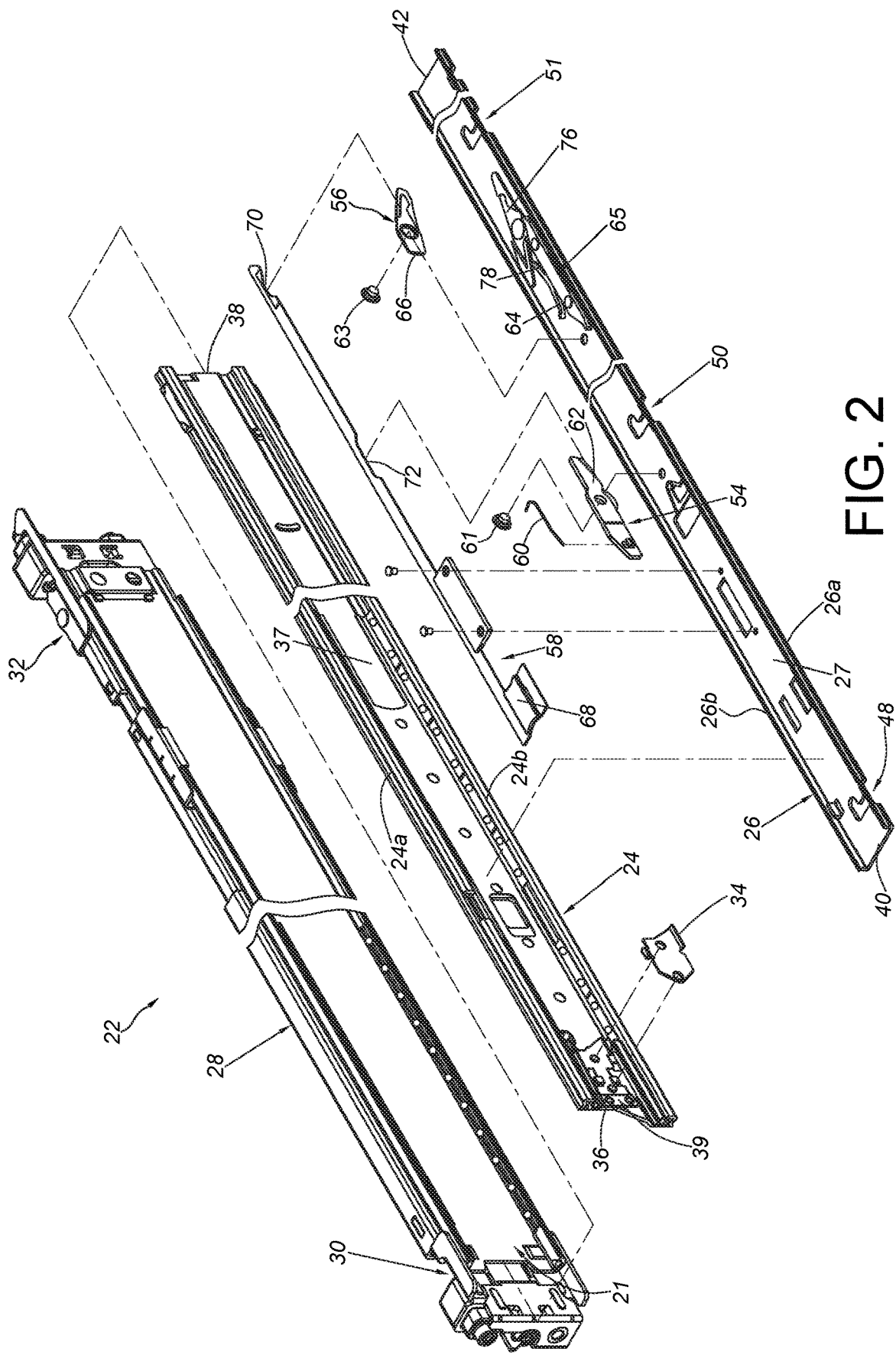
FIG. 2 is an exploded view of the slide rail assembly according to an embodiment of the present invention.

As shown in FIG. 1 and FIG. 2, in a rack system, a carried object 20 can be mounted to a rack 23 through a slide rail assembly 22. The carried object 20 can be an electronic device, a chassis or a drawer. The slide rail assembly 22 comprises a first rail 24 and a second rail 26 longitudinally movable relative to the first rail 24. Preferably, the slide rail assembly 22 further comprises a third rail 28. Wherein, the first rail 24 is movably mounted between the third rail 28 and the second rail 26.

The third rail 28 can be mounted to a first post 23a and a second post 23b of the rack 23 through a first bracket 30 and a second bracket 32. Furthermore, the third rail 28 has a passage 21.

The first rail 24 is movably mounted into the passage 21 of the third rail 28. The first rail 24 is arranged with a blocking part 34. The blocking part 34 is located between a first end 36 (such as a front end) and a second end 36 (such as a rear end) of the first rail 24. Preferably, the blocking part 34 is a protrusion, and the blocking part 34 is adjacent to the first end 36 of the first rail 24. The blocking part 34 can be integrally formed on the first rail 24; or as in the present embodiment, an additional component comprising the blocking part 34 can be fixed to the first rail 24. Furthermore, the first rail 24 comprises a first side wall 24a, a second side wall 24b and a lateral wall 37 connected between the first side wall 24a and the second side wall 24b. A mounting passage 39 is defined by the first side wall 24a, the second side wall 24b and the lateral wall 37 for accommodating the second rail 26.

Figure 3:
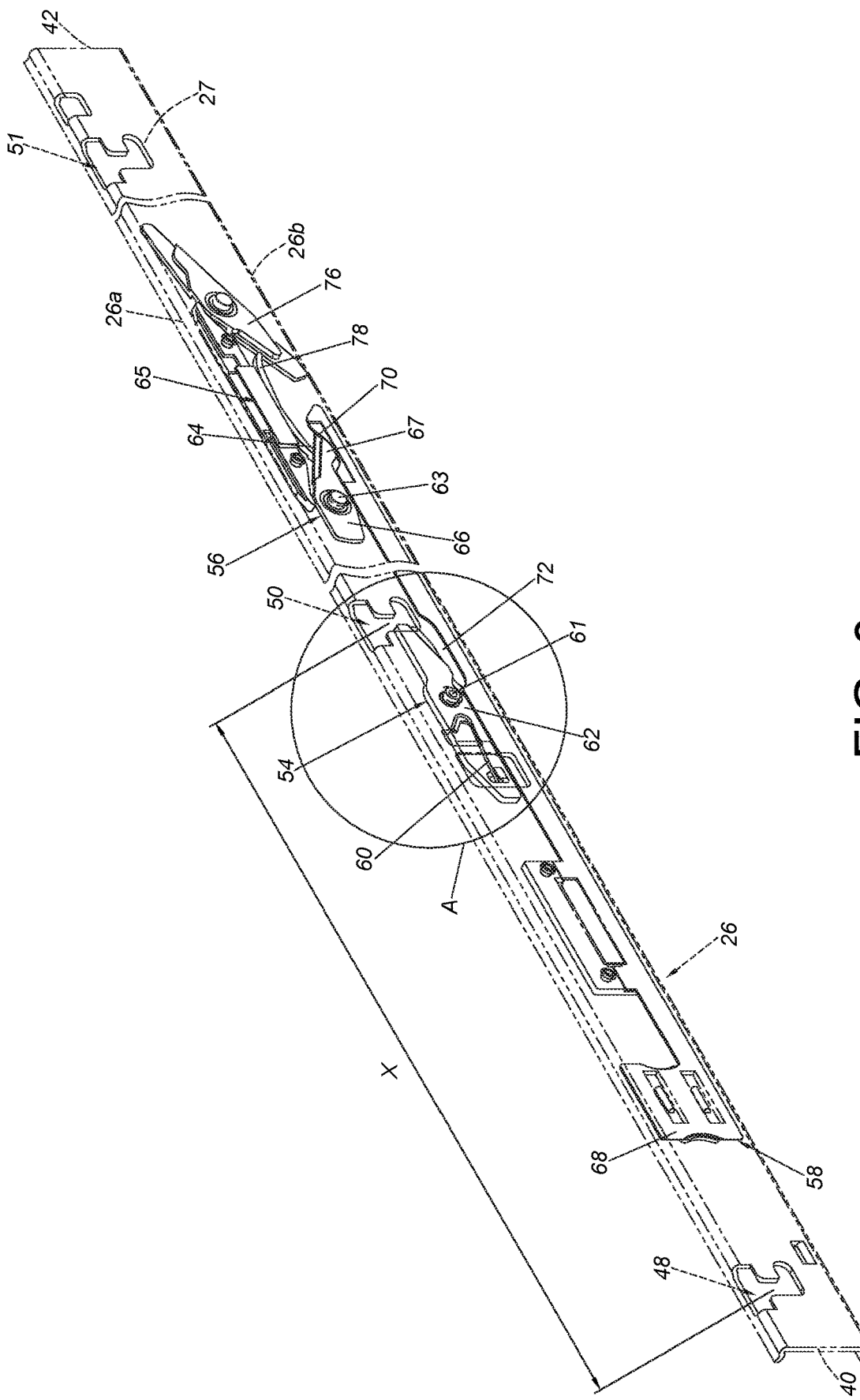
FIG. 3 is a diagram showing a slide rail kit of the slide rail assembly according to an embodiment of the present invention.

As shown in FIG. 2 and FIG. 3, the second rail 26 has a first end 40, a second end 42 and a plurality of slots (such as a first slot 48, a second slot 50 and a third slot 51) located between the first end 40 and the second end 42. The first slot 48, the second slot 50 and the third slot 51 are configured to correspondingly mount a plurality of mounting members (such as a first mounting member 52a, a second mounting member 52b and a third mounting member 52c shown in FIG. 1) at a lateral side of the carried object 20. A predetermined distance X is defined between two adjacent slots, such as the first slot 48 and the second slot 50, along a longitudinal direction of the second rail 26. In the present embodiment, the first slot 48 has substantially the same shape as the second slot 50, and the first slot 48 is adjacent to the first end 40 of the second rail 26. Furthermore, the second rail 26 comprises a first wall 26a, a second wall 26b and a longitudinal wall 27 connected between the first wall 26a and the second wall 26b. The first wall 26a, the second wall 26b and the longitudinal wall 27 of the second rail 26 respectively correspond to the first side wall 24a, the second side wall 24b and the lateral wall 37 of the first rail 24.

The slide rail assembly 22 comprises a first mechanism 54, a second mechanism 56 and a releasing connection rod 58. Wherein, the second rail 26, the first mechanism 54, the second mechanism 56 and the releasing connection rod 58 are configured to form a slide rail kit.

The first mechanism 54 is arranged on the second rail 26 and adjacent to the second slot 50. The first mechanism 54 comprises an elastic member 60 and a working member 62. The working member 62 can be partially extended to the second slot 50 of the second rail 26 in response to an elastic force of the elastic member 60 (please also refer to FIG. 4). Preferably, the working member 62 is pivoted relative to the longitudinal wall 27 of the second rail 26 through a first shaft 61, and the working member 62 is adjacent to the releasing connection rod 58.

The second mechanism 56 is arranged on the second rail 26. The second mechanism 56 comprises a first blocking member 66. Preferably, the second mechanism 56 further comprises a first elastic part 64. In the present embodiment, a mounting base 65, which has the first elastic part 64, is fixed to the second rail 26. The first blocking member 66 is configured to be held at a blocking position in response to an elastic force of the first elastic part 64. Preferably, the first blocking member 66 is pivoted relative to the longitudinal wall 27 of the second rail 26 through a second shaft 63. Preferably, the second mechanism 56 is arranged between the first mechanism 54 and the third slot 51. Preferably, the second mechanism 56 further comprises a second blocking member 76 pivoted relative to the longitudinal wall 27 of the second rail 26, and the mounting base 65 further has a second elastic part 78. The second blocking member 76 is configured to be held at a predetermined position in response to an elastic force of the second elastic part 78.

The releasing connection rod 58 is imperatively arranged on the second rail 26. The releasing connection rod 58 comprises an operating part 68 located between the first end 40 (such as the front end) of the second rail 26 and the first mechanism 54. The releasing connection rod 58 is arranged along a longitudinal direction of the longitudinal wall 27 of the second rail 26, and the releasing connection rod 58 has a driving part 70 adjacent to a corresponding portion 67 of the first blocking member 66. The driving part 70 is configured to drive the first blocking member 66 to move away from the blocking position through the corresponding portion 67. The corresponding portion 67 can be a protrusion, and the driving part 70 can have an inclined surface or an arc surface, but the present invention is not limited thereto.

Figure 4:
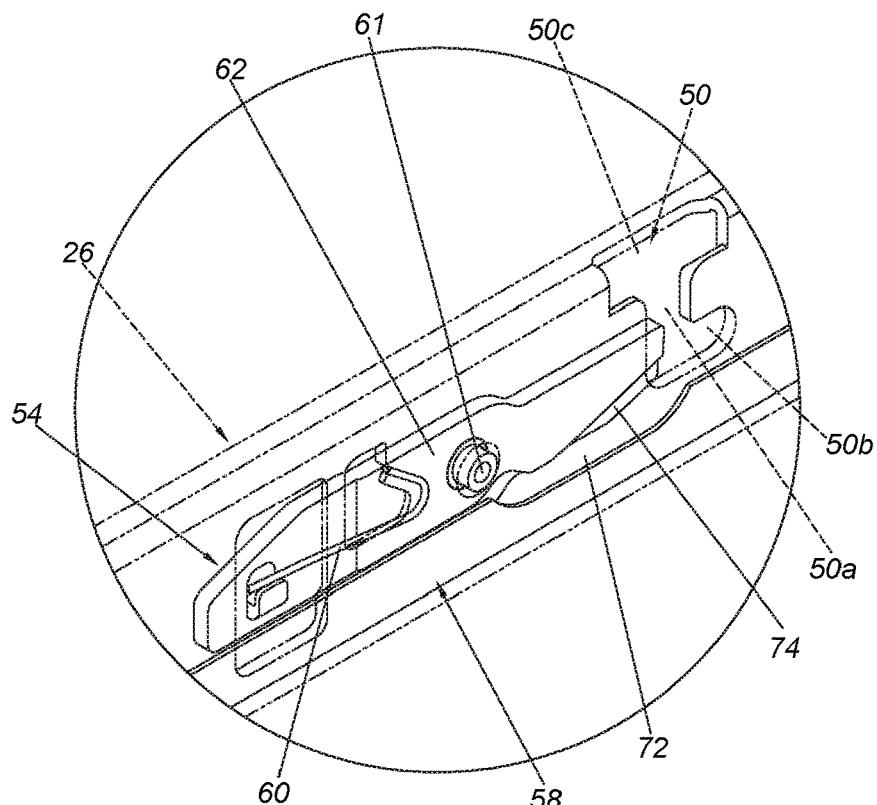
FIG. 4 is an enlarged view of an area A of FIG. 3 for showing a working member being located at a blocking position relative to a slot.

As shown in FIG. 4, the second slot 50 comprises a first part 50a and a second part 50b communicating with the first part 50a. The first part 50a and the second part 50b are J-shaped slots. However, the slots can be in a U shape or other shapes, but the present invention is not limited thereto. The working member 62 is configured to block one side of the second slot 50 of the second rail 26 in response to the elastic force of the elastic member 60. Such configuration is characterized in that when the second mounting member 52b of the carried object 20 enters the first part 50a from an opening 50c of the second slot 50 to be inserted into the second part 50b/the working member 62 is configured to block one side of one of the first part 50a and the second part 50b of the second slot 50 (such as blocking a portion of the second part 50b of the second slot 50), such that the second mounting member 52b of the carried object 20 cannot be freely moved away from the second slot 50 due to blocking of the working member 62.

Figure 5:
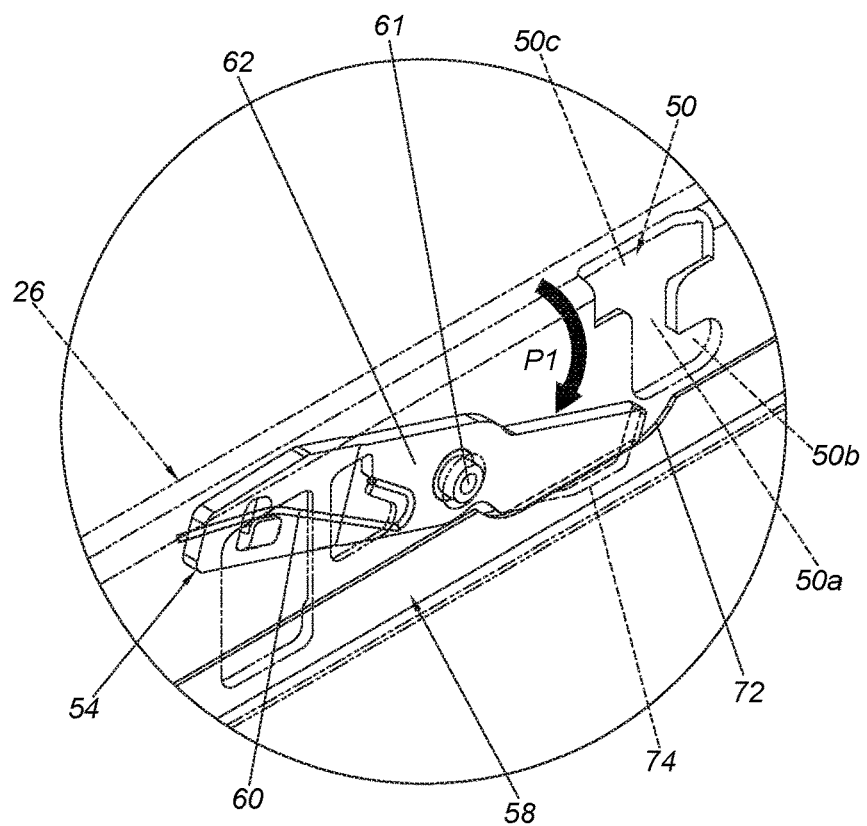
FIG. 5 is a diagram showing the working member of the slide rail assembly being located at another position relative to the slot according to an embodiment of the present invention.

As shown in FIG. 5, the working member 62 is rotatably operated to move along a first path P1 to be away from the second slot 50 of the second rail 26. In other words, the working member 62 can be operated to move along the first path P1 without blocking the second slot 50 of the second rail 26. Therefore, the second mounting member 52b of the carried object 20 can be moved from the second part 50b toward the first part 50a to be further moved away from the opening 50c of the second slot 50, in order to detach the carried object 20 from the second rail 26.

Moreover, during a process of the working member 62 being operated to move along the first path P1 to be away from the second slot 50 of the second rail 26, the working member 62 can be prevented from interfering with the releasing connection rod 58 or at least partially cross the releasing connection rod 58, such that the working member 62 is not blocked by the releasing connection rod 58 on the first path P1. For example, the releasing connection rod 56 has a notch 72, and the working member 62 has a recessed part 74. During the process of the working member 62 being operated to move along the first, path P1 to be away from one side of the second slot 50 of the second rail 26, the working member 62 can be prevented from interfering with the releasing connection rod 58 through arrangement of the recessed part 74 and the notch 72. In an alternative embodiment, the working member 62 can be prevented from interfering with the releasing connection rod 58 through arrangement of one of the recessed part 74 and the notch 72. For example, one of the releasing connection rod 58 and the working member 62 has the notch 72. During the process of the working member 62 being operated to move along the first path P1, the working member 62 can be prevented from interfering with the releasing connection rod 56 through arrangement of the notch 72. Or, one of the releasing connection rod 58 and the working member 62 has the recessed part 74. During the process of the working member 62 being operated to move along the first path P1, the working member 62 can be prevented from interfering with the releasing connection rod 58 through arrangement of the recessed part 74.

Figure 6:
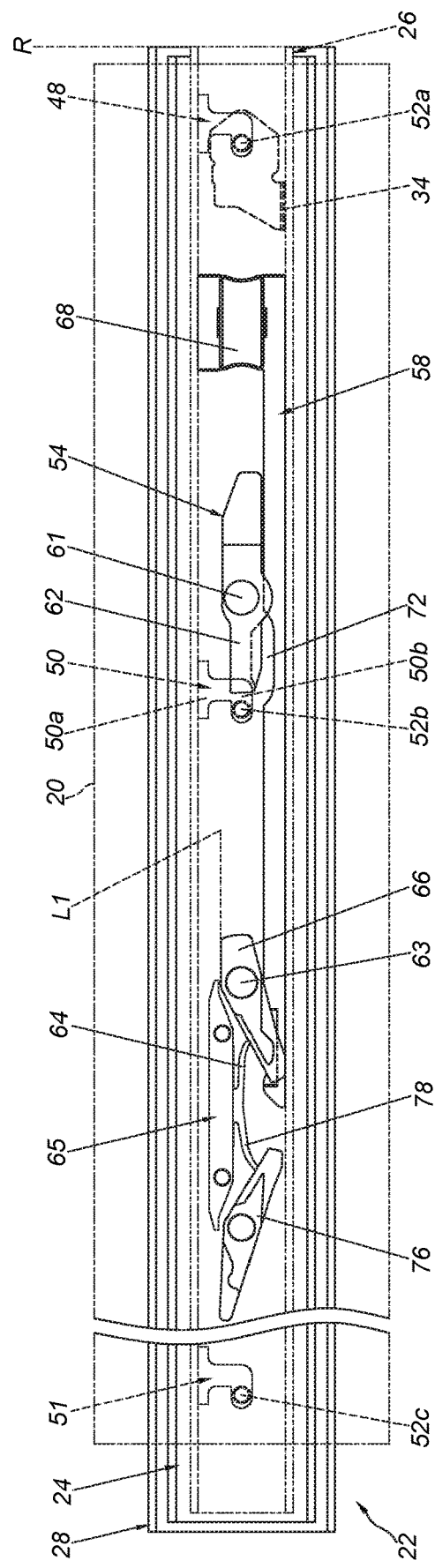
FIG. 6 is a diagram showing the slide rail assembly being in a retracted state according to an embodiment of the present invention.

As shown in FIG. 6, the slide rail assembly 22 is in a retracted state. Wherein, the second rail 26 is located at a retracted position R relative to the first rail 24 and the third rail 28. On the other hand, the first mounting member 52a, the second mounting member 52b and the third mounting member 52c of the carried object 20 are correspondingly mounted to the first slot 46, the second slot 50 and the third slot 51 of the second rail 26. Wherein, during a process of the second mounting member 52b of the carried object 20 being mounted to the second part 50b of the second slot 50, the working member 62 is pushed by the second mounting member 52b of the carried object 20 to rotate. Meanwhile, the elastic member 60 of the first mechanism 54 accumulates an elastic force (please also refer to FIG. 5). When the second mounting member 52b of the carried object 20 is moved to the second part 50b of the second slot 50, the elastic member 60 releases the elastic force, such that the working member 62 is configured to block one of the first part 50a and the second part 50b of the second slot 50, in order to prevent the second mounting member 52b of the carried object 20 from being detached form the second part 50b toward the first part 50a of the second slot 50. In addition, the first blocking member 66 is held at a blocking position L1 in response to the elastic force of the first elastic part 64; and the second blocking member 76 is held at the predetermined position in response to the elastic force of the second elastic part 78.

As shown in FIG. 7, when the first rail 24 and the second rail 26 are moved relative to the third rail 28 a predetermined distance from the retracted position R along a first direction D1, the first blocking member 66 is configured to contact the blocking part 34 of the first rail 24 at the blocking position L1.

As shown in FIG. 8, when the second rail 26 is further moved relative to the first rail 24 along the first direction D1, the first blocking member 66 is deflected from the blocking position L1 by the blocking part 34 of the first rail 24 to be located at another position L2, in order to allow the first blocking member 66 to cross the blocking part 34 of the first rail 24 along the first direction D1. Meanwhile, the first elastic part 64 is accumulating an elastic force.

As shown in FIG. 9, when the second rail 26 is further moved relative to the first rail 24 along the first direction D1 to an extension position E, the first blocking member 66 has crossed the blocking part 34 of the first rail 24. Wherein, the first blocking member 66 returns to the blocking position L1 in response to the elastic force of the first elastic part 64. When the first blocking member 66 is located at the blocking position L1, the first blocking member 66 is corresponding to a first side of the blocking part 34 of the first rail 24. On the other hand, the second blocking member 76 is located at the predetermined position and corresponding to a second side of the blocking part 34 of the first rail 24. Specifically, the second rail 26 can be held at the extension position E relative to the first rail 24. For example, when the first blocking member 66 is located at the blocking position L1 and corresponding to the first side of the blocking part 34 of the first rail 24, the second rail 26 is not able to move away from the extension position E relative to the first rail 24 along a direction (such as a second direction D2 opposite to the first direction D1).

Moreover, since the second blocking member 76 is pivoted relative to the longitudinal wall 27 of the second rail 26, the second blocking member 76 can be operated to move away from the predetermined position. Wherein, the second blocking member 76 can be manually operated or operated through another releasing connection rod 58. When the second blocking member 76 is moved away from the predetermined position, the second rail 26 can be detached from the first rail 24.

As shown in FIG. 10, when the second rail 26 is going to be retracted relative to the first rail 24 along the second direction D2, a user can operate the operating part 68 to move the releasing connection rod 58 along a second path P2 in order to drive the first blocking member 66 to move away from the blocking position L1 to be no longer corresponding to the blocking part 34 of the first rail 24 through arrangement of the driving part 70 and the corresponding portion 67. In other words, the second rail 26 can be retracted relative to the first rail 24 from the extension position E along the second direction D2. Wherein, a direction of the second path P2 (such as a longitudinal direction) is different from a direction of the first path P1 (such as a rotary direction).

Moreover, in the present embodiment, the operating part 66 of the releasing connection rod 58 is located between the first end 40 of the second rail 26 and the first mechanism 54. The operating part 68 is arranged to be close to the first end 40 (such as a front end) of the second rail 26 in order to allow the user to conveniently operate the releasing connection rod 58, for facilitating maintenance of the second rail 26 or the carried object 20.

As shown in FIG. 11 and FIG. 12, the slide rail assembly 22 is in an extended state, wherein, the second rail 26 is located at the extension position E relative to the first rail 24, and the carried object 20 is mounted to the second rail 26. When the working member 62 of the first mechanism 54 blocks one of the first part 50a and the second part 50b of the second slot 50, movement of the carried object 20 relative to the second rail 26 along the first direction D1 is restricted by the working member 62, such that the carried object 20 cannot be detached from the second rail 26.

As shown in FIG. 13 and FIG. 14, when the working member 62 is operated to move away form the second slot 50 of the second rail 26, the second mounting member 52b of the carried object 20 can be moved away from the second part 50b toward the first part 50a of the second slot 50, so as to detach the carried object 20 from the second rail 26. Wherein, when the second mounting member 52b is moved away from the second slot 50, the working member 62 is configured to be partially extended to the second slot 50 of the second rail 26 again in response to the elastic force of the elastic member 60.

Therefore, the slide rail assembly and the slide rail kit of the present invention are characterized in that:

1. The operating part 68 of the releasing connection rod 58 is located between the first end 40 of the second rail 26 and the first mechanism 54, and the operating part 68 is arranged to be close to the first end 40 (such as the front end) of the second rail 26 in order to allow the user to conveniently operate the releasing connection rod 58, for facilitating maintenance of the second rail 26 or the carried object 20.

2. The working member 62 is adjacent to the releasing connection rod 58. During the process of the working member 62 being operated to move away from the second slot 50 of the second rail 26, the working member 62 is configured to be prevented from interfering with the releasing connection rod 58, such that the working member 62 is not blocked by the releasing connection rod 58 on the first path P1 (along the rotary direction).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide rail assembly, comprising:
a first rail arranged with a blocking part;
a second rail movable relative to the first rail, the second rail having a first end, a second end and a plurality of slots arranged between the first end and the second end;
a first mechanism arranged on the second rail, the first mechanism comprising an elastic member and a working member partially extended to one of the plurality of slots of the second rail in response to an elastic force of the elastic member, wherein the working member is configured to be operated to move away from one of the plurality of slots of the second rail along a first path;
a second mechanism arranged on the second rail, the second mechanism comprising an elastic part and a blocking member, wherein the blocking member is configured to be held at a blocking position in response to an elastic force of the elastic part; when the second rail is moved relative to the first rail to an extension position, the blocking member of the second mechanism is located at the blocking position and corresponding to the blocking part of the first rail, such that the second rail is not able to move away from the extension position relative to the first rail along a predetermined direction; and
a releasing connection rod comprising an operating part located between the first end of the second rail and the first mechanism, the operating part being configured to be operated to move the releasing connection rod along a second path in order to drive the blocking member of the second mechanism to move away from the blocking position to be no longer corresponding to the blocking part of the first rail;
wherein one of the releasing connection rod and the working member has a notch, and the other one of the releasing connection rod and the working member has a recessed part; during a process of the working member being operated to move away from one of the plurality of slots of the second rail along the first path, the working member is configured to be prevented from interfering with the releasing connection rod through arrangement of the recessed part and the notch, such that the working member is not blocked by the releasing connection rod on the first path.

2. The slide rail assembly of claim 1, wherein the plurality of slots are arranged along a longitudinal direction of the second rail, the plurality of slots comprises a first slot and a second slot, the first slot is adjacent to the first end of the second rail, and the second slot is adjacent to the first mechanism.

3. The slide rail assembly of claim 2, wherein a predetermined distance is defined between two adjacent slots.

4. The slide rail assembly of claim 1, wherein the second rail comprises a first wall, a second wall and a longitudinal wall connected between the first wall and the second wall, the releasing connection rod is arranged along a longitudinal direction of the longitudinal wall of the second rail, the working member of the first mechanism is pivoted relative to the longitudinal wall of the second rail, and the working member is adjacent to the releasing connection rod.

5. The slide rail assembly of claim 1, wherein a direction of the first path is different from a direction of the second path.

6. The slide rail assembly of claim 1, wherein the first rail has a first end and a second end, and the blocking part is adjacent to the first end of the first rail.

7. A slide rail assembly, comprising:
a first rail arranged with a blocking part;
a second rail movable relative to the first rail, the second rail having a first end, a second end and a plurality of slots arranged between the first end and the second end;
a first mechanism arranged on the second rail, the first mechanism comprising an elastic member and a working member configured to block one side of one of the plurality of slots of the second rail in response to an elastic force of the elastic member, wherein the working member is configured to be operated to move along a first path without blocking one of the plurality of slots of the second rail;
a second mechanism arranged on the second rail, the second mechanism comprising a blocking member, wherein when the second rail is moved relative to the first rail to an extension position, the blocking member of the second mechanism is located at a blocking position and corresponding to the blocking part of the first rail, such that the second rail is not able to move away from the extension position relative to the first rail along a predetermined direction; and
a releasing connection rod comprising an operating part arranged between the first end of the second rail and the first mechanism, the operating part being configured to be operated to move the releasing connection rod along a second path in order to drive the blocking member of the second mechanism to move away from the blocking position to be no longer corresponding to the blocking part of the first rail;
wherein one of the releasing connection rod and the working member has a notch, and the other one of the releasing connection rod and the working member has a recessed part; during a process of the working member being operated to move along the first path, the working member is configured to be prevented from interfering with the releasing connection rod through arrangement of the recessed part and the notch, such that the working member is not blocked by the releasing connection rod on the first path.

8. The slide rail assembly of claim 7, wherein the plurality of slots are arranged along a longitudinal direction of the second rail, the plurality of slots comprises a first slot and a second slot, the first slot is adjacent to the first end of the second rail, and the second slot is adjacent to the first mechanism.

9. The slide rail assembly of claim 7, wherein a predetermined distance is defined between two adjacent slots.

10. The slide rail assembly of claim 7, wherein the second rail comprises a first wall, a second wall and a longitudinal wall connected between the first wall and the second wall, the releasing connection rod is arranged along a longitudinal direction of the longitudinal wall of the second rail, the working member of the first mechanism is pivoted relative to the longitudinal wall of the second rail, and the working member is adjacent to the releasing connection rod.

11. The slide rail assembly of claim 7, wherein a direction of the first path is different from a direction of the second path.

12. The slide rail assembly of claim 7, wherein the first rail has a first end and a second end, and the blocking part is adjacent to the first end of the first rail.

13. The slide rail assembly of claim 7, wherein the blocking member is pivoted relative to the second rail, the second mechanism further comprises an elastic part, and the blocking member is held at the blocking position in response to an elastic force of the elastic part.

14. A slide rail kit, comprising:
a rail having a first end, a second end and a plurality of slots arranged between the first end and the second end, the rail comprising a first wall, a second wall and a longitudinal wall connected between the first wall and the second wall;
a first mechanism arranged on the rail, the first mechanism comprising an elastic member and a working member configured to block one side of one of the plurality of slots of the rail in response to an elastic force of the elastic member, wherein the working member is configured to be operated to move along a first path without blocking one of the plurality of slots of the rail;
a second mechanism arranged on the rail, the second mechanism comprising a blocking member, wherein the blocking member is configured to be located at a blocking position; and
a releasing connection rod operatively arranged on the rail, the releasing connection rod comprising an operating part configured to be operated to move the releasing connecting rod along a second path in order to drive the blocking member of the second mechanism to move away from the blocking position;
wherein the releasing connection rod is arranged along a longitudinal direction of the longitudinal wall of the rail, and the working member of the first mechanism is pivoted relative to the longitudinal wall of the rail and adjacent to the releasing connection rod; during a process of the working member being operated to move along the first path, the working member is configured to be prevented from interfering with the releasing connection rod;
wherein one of the releasing connection rod and the working member has a notch; during the process of the working member being operated to move along the first path, the working member is configured to be prevented from interfering with the releasing connection rod through arrangement of the notch.

15. A slide rail kit, comprising:
a rail having a first end, a second end and a plurality of slots arranged between the first end and the second end, the rail comprising a first wall, a second wall and a longitudinal wall connected between the first wall and the second wall;
a first mechanism arranged on the rail, the first mechanism comprising an elastic member and a working member configured to block one side of one of the plurality of slots of the rail in response to an elastic force of the elastic member, wherein the working member is configured to be operated to move along a first path without blocking one of the plurality of slots of the rail;
a second mechanism arranged on the rail, the second mechanism comprising a blocking member, wherein the blocking member is configured to be located at a blocking position; and
a releasing connection rod operatively arranged on the rail, the releasing connection rod comprising an operating part configured to be operated to move the releasing connecting rod along a second path in order to drive the blocking member of the second mechanism to move away from the blocking position;
wherein the releasing connection rod is arranged along a longitudinal direction of the longitudinal wall of the rail, and the working member of the first mechanism is pivoted relative to the longitudinal wall of the rail and adjacent to the releasing connection rod; during a process of the working member being operated to move along the first path, the working member is configured to be prevented from interfering with the releasing connection rod;
wherein one of the releasing connection rod and the working member has a recessed part; during the process of the working member being operated to move along the first path, the working member is configured to be prevented from interfering with the releasing connection rod through arrangement of the recessed part.

* * * * *